(12) United States Patent
Hashimoto

(10) Patent No.: US 7,001,797 B2
(45) Date of Patent: Feb. 21, 2006

(54) OPTICAL DEVICE AND METHOD OF MANUFACTURING THE SAME, OPTICAL MODULE, CIRCUIT BOARD, AND ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 251 days.

(21) Appl. No.: 10/308,877

(22) Filed: Dec. 3, 2002

(65) Prior Publication Data

US 2003/0122137 A1 Jul. 3, 2003

(30) Foreign Application Priority Data

Dec. 27, 2001 (JP) .................................. 2001-397051

(51) Int. Cl.
- *H01L 21/50* (2006.01)
- *H01L 21/78* (2006.01)
- *H01L 21/782* (2006.01)
- *H01L 21/784* (2006.01)

(52) U.S. Cl. .................... 438/113; 438/116; 438/460

(58) Field of Classification Search ............. 438/113, 438/116, 460

See application file for complete search history.

(56) References Cited

U.S. PATENT DOCUMENTS

| | | | | |
|---|---|---|---|---|
| 5,915,168 A | * | 6/1999 | Salatino et al. | 438/110 |
| 5,923,958 A | * | 7/1999 | Chou | 438/118 |
| 6,428,650 B1 | * | 8/2002 | Chung | 156/250 |
| 6,448,544 B1 | * | 9/2002 | Stanton et al. | 250/208.1 |
| 6,483,030 B1 | * | 11/2002 | Glenn et al. | 174/52.4 |
| 6,492,699 B1 | * | 12/2002 | Glenn et al. | 257/433 |
| 6,521,482 B1 | * | 2/2003 | Hyoudo et al. | 438/110 |
| 6,599,770 B1 | * | 7/2003 | Miyamoto | 438/48 |
| 6,759,723 B1 | * | 7/2004 | Silverbrook | 257/433 |
| 6,780,667 B1 | * | 8/2004 | Iizima et al. | 438/64 |
| 2001/0008300 A1 | * | 7/2001 | Yoshihara et al. | 257/620 |
| 2004/0161871 A1 | * | 8/2004 | Omori | 438/68 |

FOREIGN PATENT DOCUMENTS

| | | |
|---|---|---|
| JP | 63-062267 | 3/1988 |
| JP | 06-132513 | 5/1994 |
| JP | 08-257651 | 10/1996 |
| JP | 11-162641 | 6/1999 |
| JP | 2000-253210 | 9/2000 |
| JP | 2001-166193 | 6/2001 |
| JP | 2001-223079 | 8/2001 |
| JP | 2001-339118 | 12/2001 |
| WO | 99/64893 | 12/1999 |

OTHER PUBLICATIONS

U.S. Appl. No. 10/306,789.
U.S. Appl. No. 10/290,062.
U.S. Appl. No. 10/292,372.

* cited by examiner

*Primary Examiner*—M. Wilczewski
(74) *Attorney, Agent, or Firm*—Hogan & Hartson, LLP

(57) ABSTRACT

A plurality of covers each of which has a light transmitting section are attached to a substrate on which is formed a plurality of optical elements each of which has an optical section, and each of the optical sections is sealed by each of the covers. Then, the substrate is cut into individual ones of the optical elements.

16 Claims, 9 Drawing Sheets

OPTICAL DEVICE AND METHOD OF MANUFACTURING THE SAME, OPTICAL MODULE, CIRCUIT BOARD, AND ELECTRONIC INSTRUMENT

Japanese Patent Application No. 2001-397051, filed on Dec. 27, 2001, is hereby incorporated by reference in its entirety.

BACKGROUND OF THE INVENTION

The present invention relates to an optical device and method of manufacture thereof, to an optical module, and to a circuit board and electronic instrument.

In an optical element having an optical section such as a light receiving section or the like, it is known to be preferable to provide a space between the surface bearing the optical section and a cover for sealing. For this purpose, the method of manufacturing an optical device is known in which, after the optical elements are cut apart and diced, the optical section is sealed by a cover, with a space provided between the optical section and the cover. When cutting a substrate such as a wafer or the like by dicing or similar method, swarf and the like is generated. If debris such as this swarf or the like is in contact with the optical section when it is sealed, it is not possible thereafter to remove the debris from this space, and there is the problem that the quality of the optical device is reduced. In particular, in the case of a solid state imaging device having an optical section with a microlens, since the microlens has a relief surface, debris attaches easily, and complete removal is difficult. Therefore, in the case that there is an optical section with a microlens, there is the problem that the quality of the solid state imaging device tends to be even further reduced.

BRIEF SUMMARY OF THE INVENTION

A method of manufacturing an optical device according to the first aspect of the present invention comprises the steps of:
(a) attaching a plurality of covers each of which has a light transmitting section to a substrate on which is formed a plurality of optical elements each of which has an optical section, and sealing each of the optical sections by each of the covers; and
(b) cutting the substrate into individual ones of the optical elements.

An optical device according to the second aspect of the present invention is manufactured by the above method.

An optical module according to the third aspect of the present invention comprises:
the above described optical device, and
a support member to which the optical device is attached.

A circuit board according to the fourth aspect of the present invention comprises the above described optical module mounted thereon.

A circuit board according to the fifth aspect of the present invention comprises the above described optical module.

DETAILED DESCRIPTION OF THE EMBODIMENT

Figure 1A:
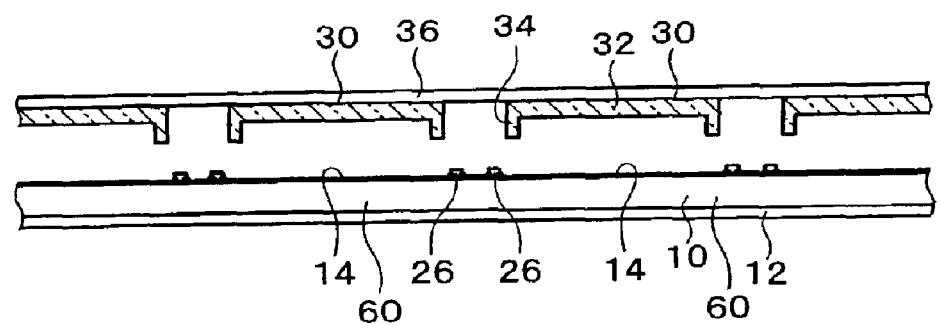
FIGS. 1A and 1B illustrate a first embodiment of the method of manufacturing an optical device according to the present invention.

Embodiments of the present invention may provide a high quality optical device and method of manufacture thereof, optical module, circuit board, and electronic instrument.

(1) A method of manufacturing an optical device according to one embodiment of the present invention comprises the steps of:
(a) attaching a plurality of covers each of which has a light transmitting section to a substrate on which is formed a plurality of optical elements each of which has an optical section, and sealing each of the optical sections by each of the covers; and
(b) cutting the substrate into individual ones of the optical elements.

According to this configuration, since the optical section is sealed before separating the substrate, no debris enters the sealed chamber, and a high quality optical device can be obtained.

(2) In this method of manufacturing an optical device:
in the step (a), the covers may be attached to the substrate in a single operation, in a state in which the covers are relatively fixed.

By means of this, attachment of the covers is made simple.

(3) In this method of manufacturing an optical device:
the covers may be attached to a sheet so that the covers are relatively fixed.

(4) In this method of manufacturing an optical device:
the covers may be connected by connecting sections so that the covers are relatively fixed, and the method further comprises:
after the step (a), cutting the connecting sections.

(5) In this method of manufacturing an optical device:
the covers may be formed integrally together with the connecting sections.

(6) In this method of manufacturing an optical device:
the connecting sections may be cut by a first cutter, and the substrate may be cut by a second cutter.
(7) In this method of manufacturing an optical device:
the width of the first cutter may be greater than the width of the second cutter.
(8) In this method of manufacturing an optical device:
each of the optical elements may have electrodes formed on outside of each of the optical sections, and
parts of the connecting sections above the electrodes may be removed, when the connecting sections are cut.
According to this, since the space over the electrodes on the substrate is left free, electrical connection to the electrodes is made easier to accomplish.
(9) In this method of manufacturing an optical device:
each of the covers entirely may have light transmitting characteristics.
(10) In this method of manufacturing an optical device:
each of the covers may comprise a plate section to be disposed above each of the optical sections, and a spacer section formed on the periphery of the plate section, and at least a part of the plate section may be the light transmitting section.
(11) In this method of manufacturing an optical device:
in the step (a), each of the optical sections may be sealed so that a space is formed between each of the covers and each of the optical sections.
(12) In this method of manufacturing an optical device:
in the step (a), each of the optical sections may be sealed so that the space is evacuated.
(13) In this method of manufacturing an optical device:
in the step (a), each of the optical sections may be sealed by decreasing pressure of the space lower than atmospheric pressure.
(14) In this method of manufacturing an optical device:
in the step (a), each of the optical sections may be sealed so that the space is filled with nitrogen.
(15) In this method of manufacturing an optical device:
in the step (a), each of the optical sections may be sealed so that the space is filled with dry air.
(16) In this method of manufacturing an optical device:
at least visible light may pass through the light transmitting section, and no infrared light may pass through the light transmitting section.
(17) In this method of manufacturing an optical device:
the substrate on which the optical sections is formed may be a semiconductor wafer.
(18) In this method of manufacturing an optical device:
each of the optical sections may have a plurality of light receiving sections arranged for image sensing.
(19) In this method of manufacturing an optical device:
each of the optical sections may have a color filter provided above each of the light receiving section.
(20) In this method of manufacturing an optical device:
each of the optical sections may have a microlens array on a surface of the substrate.
(21) An optical device according to one embodiment of the present invention is manufactured by the above method.
(22) An optical module according to one embodiment of the present invention comprises:
the above described optical device; and
a support member to which the optical device is attached.
(23) A circuit board according to one embodiment of the present invention comprises the above described optical module mounted thereon.
(24) A circuit board according to one embodiment of the present invention comprises the above described optical module.

The embodiment of the present invention is now described with reference to the drawings.

First Embodiment

FIGS. 1A to 6B illustrate the first embodiment of the optical device and method of manufacture thereof according to the present invention. In this embodiment, as shown in FIGS. 1A and 1B, a cover 30 is attached to a substrate 10.

Figure 2:
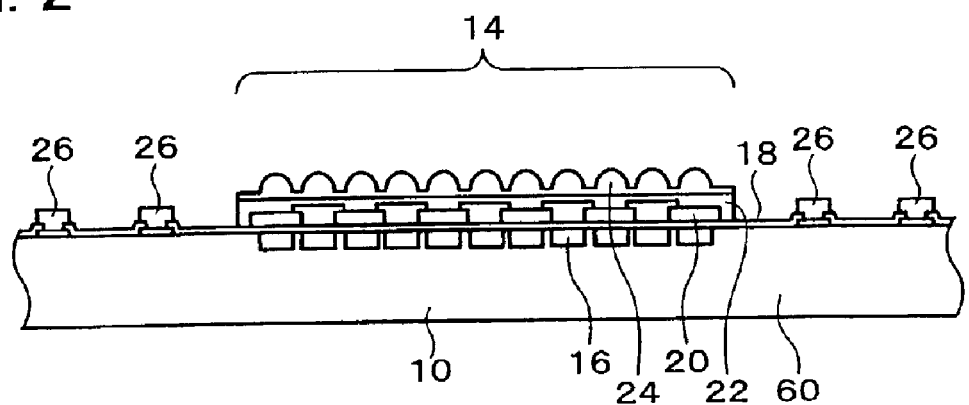
FIG. 2 illustrates a first embodiment of the method of manufacturing an optical device according to the present invention.

On the substrate 10, to improve the workability in the cutting process described below, a sheet 12 may be applied. FIG. 2 is an enlarged view of part of the substrate 10. The substrate 10 has a plurality of optical elements 60, including optical sections 14. The optical element 60 includes the optical section 14 and electrodes 26. The optical section 14 is a portion at which light enters or exits. The optical section 14 converts between light energy and other forms of energy (for example electricity). That is to say, a single optical section 14 comprises a plurality of energy transducers (light receiving sections or photoemitters) 16.

In this embodiment, each optical section 14 has a plurality of energy transducers (light receiving sections or image sensors) 16. The plurality of energy transducers 16 is disposed in two dimensions, so as to be able to carry out image sensing. That is to say, the optical device or optical module manufactured in this embodiment is a solid state imaging device being an image sensor (for example, CCD, or CMOS sensor) or the like. The energy transducer 16 is covered by a passivation film 18. The passivation film 18 has light transmitting characteristics. If the substrate 10 includes a semiconductor substrate (for example, a semiconductor wafer), then the passivation film 18 may be formed of $SiO_2$ or SiN.

The optical section 14 may have a color filter 20. The color filter 20 is formed over the passivation film 18. Over the color filter 20 a leveling layer 22 may be provided, and a microlens array 24 may be provided over this.

On the substrate 10, a plurality of the electrodes 26 is formed. The electrodes 26 shown in FIG. 2 have bumps formed on pads, but these may equally be pads only. The electrodes 26 for an individual optical element 60 are preferably formed on the outside of the optical section 14. The electrodes 26 are formed between adjacent optical sections 14. A single optical section 14 corresponds to a group of electrodes 26 (plural). For example, as shown in FIG. 6B, the electrodes 26 may be disposed along a plurality of sides (for example, two opposing sides) or along one side (not shown in the drawings) of the optical section 14.

Figure 3:
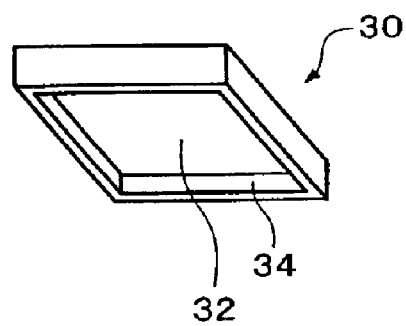
FIG. 3 illustrates a first embodiment of the method of manufacturing an optical device according to the present invention.

The cover 30 seals the optical section 14. The cover 30, as shown in the enlargement in FIG. 3, comprises a plate 32 and a spacer 34. The form of the plate 32 is not particularly restricted, but for example, as shown in FIG. 3, is a quadrilateral. The plate 32 is disposed above the optical section 14. The spacer 34 is formed to project around the periphery of the plate 32. The spacer 34 is formed continuously, without a break. The spacer 34 is disposed to surround the optical section 14, and supports the plate 32 over the optical section 14. The spacer 34 may have a height comparable to that of the space formed between the optical section 14 and the plate 32. The cover 30 shown in FIG. 3 has the plate 32 and spacer 34 formed integrally. For example, the cover 30 can be formed by resin injection molding.

At least the part of the cover 30 disposed over the optical section 14 is a light transmitting section. For example, at least a part (or the whole) of the plate 32 has light transmitting characteristics. Alternatively, the whole of the cover 30 may has light transmitting characteristics. For example, both the plate 32 and spacer 34 may have light transmitting characteristics. As long as the light transmitting section of the cover 30 (for example, the plate 32) permits light to pass, the magnitude of light losses is not an issue, and it is sufficient if light of particular wavelengths only is passed. The light transmitting section of the cover 30 (for example, the plate 32) may transmit visible light, but not transmit light in the infrared range. The light transmitting section of the cover 30 (for example, the plate 32) may have low losses in the visible light range, but high losses in the infrared range. Alternatively, the surface of the cover 30, for example the surface of the plate 32 may be treated so as to transmit visible light but not transmit radiation in the infrared region, or may be treated so as to have low losses with respect to visible light but high losses with respect to radiation in the infrared region. More concretely, a film may be provided on the surface of the cover 30, for example on the surface of the plate 32, which allows visible light to pass but does not allow radiation in the infrared region to pass, or a film may be provided which has low losses with respect to visible light but high losses with respect to radiation in the infrared region. At least the light transmitting section of the cover 30 is preferably formed of an optically transmitting insulator, such as glass or the like.

Figure 4:
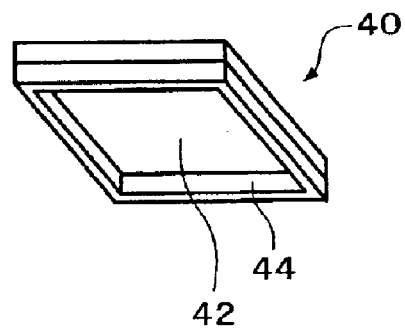
FIG. 4 illustrates a variant of the first embodiment of the method of manufacturing an optical device according to the present invention.

FIG. 4 shows a variant form of the cover. A cover 40 shown in FIG. 4 comprises a plate 42 and spacer 44 constructed as separate members. As the plate 42 may be used optical glass, or a plastic plate may be used. The spacer 44 may be formed of resin or metal. The plate 42 and spacer 44 may be joined with adhesive.

Figure 1B:
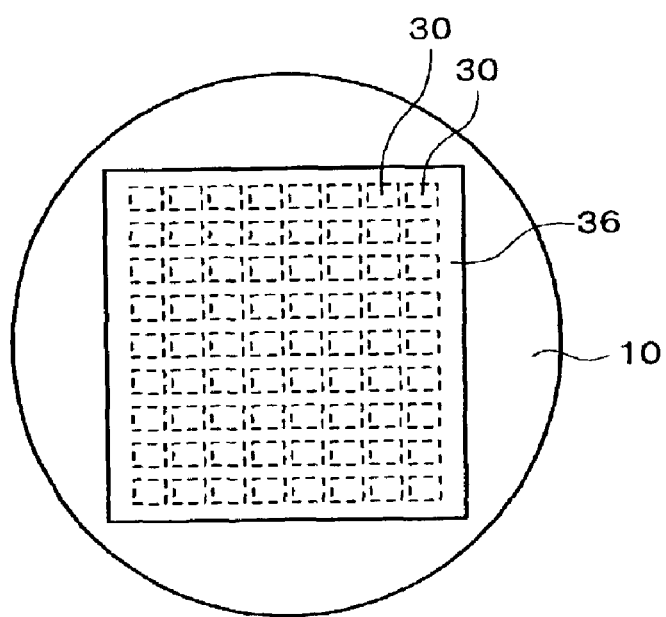

On the substrate 10 is formed a plurality of optical elements 60 having optical sections 14, and the cover 30 is attached to the substrate 10 to correspond to an optical section 14. The individual covers 30 may be attached separately, or a plurality of the covers 30 may be attached to the substrate 10 in a single operation while held in fixed relative positions. For example, as shown in FIGS. 1A and 1B, a plurality of the covers 30 may be applied to a sheet 36, so that a plurality of the covers 30 is held in fixed relative positions. As shown in FIG. 1B, a plurality of the covers 30 may be arranged in a matrix.

To attach the cover 30 to the substrate 10, an adhesive not shown in the drawings may be used. The adhesive is applied to at least one of the cover 30 (spacer 34) and the substrate 10. If as the adhesive a thermoplastic resin is used, the adhesive may be subjected to provisional curing by irradiation with ultraviolet radiation or the like to reduce its plasticity before performing the attachment, and then the adhesion force activated by heating. By means of this, the adherence of the adhesive to the optical section 14 is prevented. Immediately before attaching the cover 30, it is preferable to apply a treatment in which the surface of the optical section 14 is washed by washing, drying, and the like, whereby debris, fluff, and the like is eliminated.

Figure 5A:
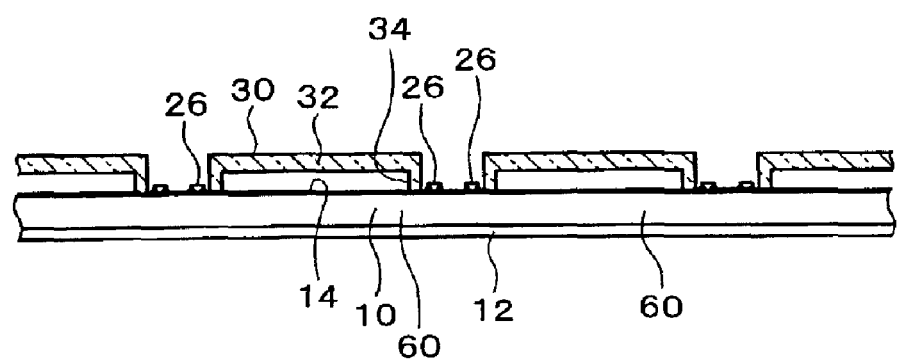
FIGS. 5A and 5B illustrate a first embodiment of the method of manufacturing an optical device according to the present invention.

As shown in FIG. 5A, through the above described process, the cover 30 is attached to the substrate 10. It should be noted that if necessary, the sheet 36 applied to the cover 30 is peeled off. The cover 30 attached to the substrate 10 seals the optical section 14. In this embodiment, the optical section 14 is sealed so as to form a space between the cover 30 (plate 32) and the substrate 10. Here, the space may be at a pressure less than atmospheric pressure, or may be evacuated, or filled with nitrogen or dry air. For example, the sealing process is carried out at a pressure less than atmospheric pressure, or in a vacuum, or nitrogen or dry air atmosphere.

Figure 5B:
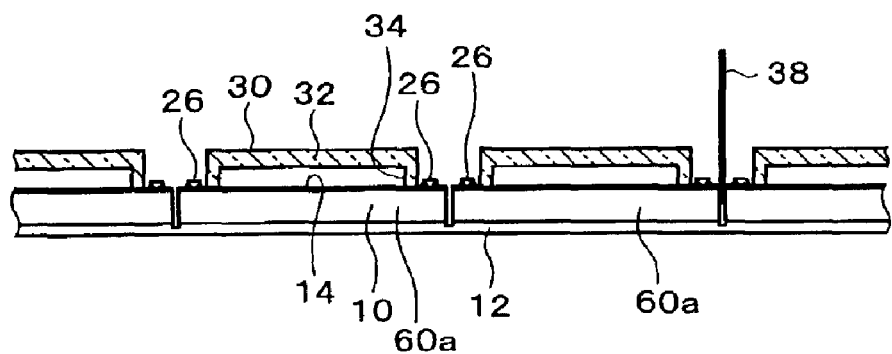

As shown in FIG. 5B, the substrate 10 is separated, forming individual optical elements 60. For this separation, a cutter 38 (for example, a dicing blade) is used. The substrate 10 is separated outside the optical sections 14, and further outside the electrodes 26. In the example shown in FIG. 5B, between adjacent optical sections 14 are formed electrodes 26 for the respective optical sections 14, and the substrate 10 is separated between these electrodes 26 (plural). If the sheet 12 is applied to the substrate 10, even when the substrate 10 is separated into individual optical elements 60, the optical elements 60 are still held together. In this way, an optical device is obtained. According to this embodiment, since the optical sections 14 are sealed before the substrate 10 is separated, no debris enters the sealed chamber, and a high quality optical device can be obtained.

Figure 6A:
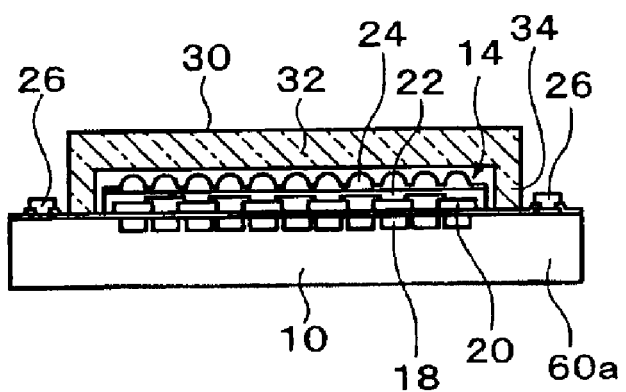
FIGS. 6A and 6B illustrate a first embodiment of the optical device according to the present invention.
Figure 6B:
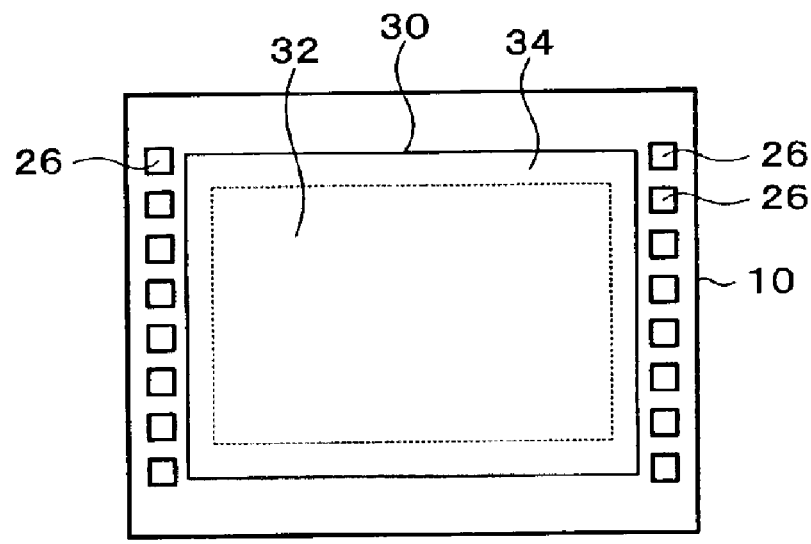

FIGS. 6A and 6B illustrate a first embodiment of the optical device according to the present invention. The optical device comprises an optical element 60a and the cover 30. Light enters the optical section 14 through the light transmitting section of the cover 30 (plate 32). The optical section 14 provided on the substrate 10 is sealed by the cover 30. Between the optical section 14 and the cover 30 (plate 32) a space is formed. This space may be at a pressure less than atmospheric pressure, may be evacuated, or may be filled with nitrogen or dry air. By means of this, condensation is made less likely to occur in the optical section 14. Further, when the space is at a pressure less than atmospheric pressure or is a vacuum, then when there is a heating process after the above described sealing process of the optical section 14, bursting due to the thermal expansion of the gas within the sealed chamber can be prevented. Outside the optical section 14, and further outside the cover 30, electrodes 26 are provided on the substrate 10. In respect of other details, the observations described in the above described method of manufacturing an optical device apply.

The present invention is not restricted to the above described embodiment, and various modifications are possible. For example, the present invention includes substantially the same construction as the construction described in the embodiment (for example, a construction for which the function, method, and result are the same, or a construction of which the purpose and result are the same). The present invention includes a construction in which parts which are not of the essence of the construction described in the embodiment are replaced. The present invention includes a construction having the same effect as the construction described in the embodiment or a construction capable of achieving the same purpose. The present invention includes a construction having the construction described in the embodiment to which is added well-known art.

Second Embodiment

Figure 7A:
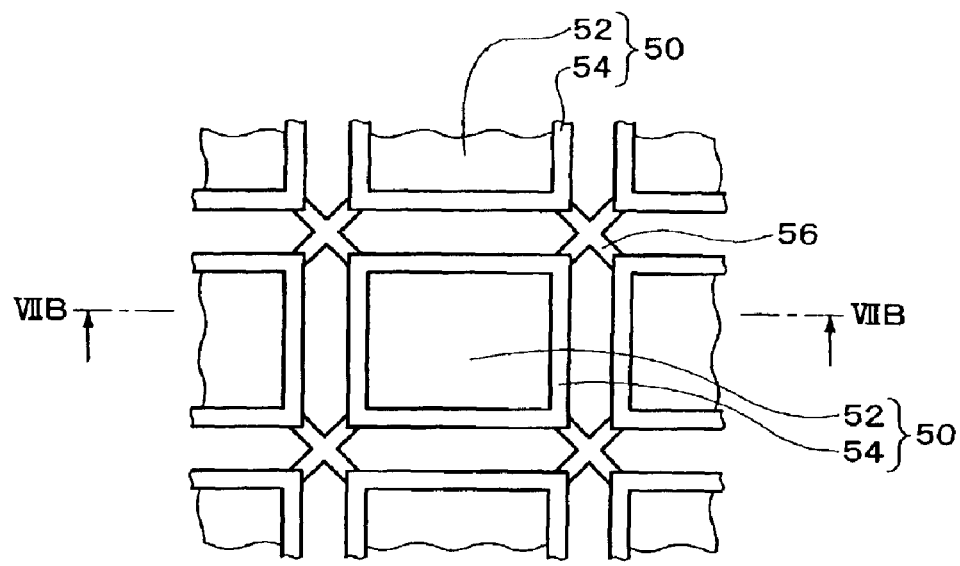
FIGS. 7A and 7B illustrate a second embodiment of the method of manufacturing an optical device according to the present invention.
Figure 7B:
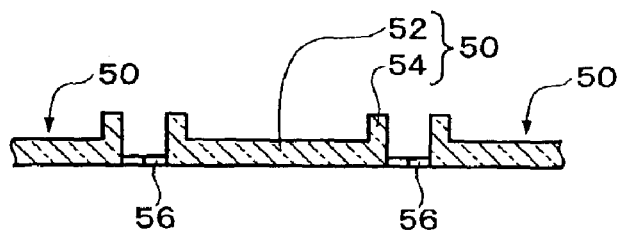
Figure 8:
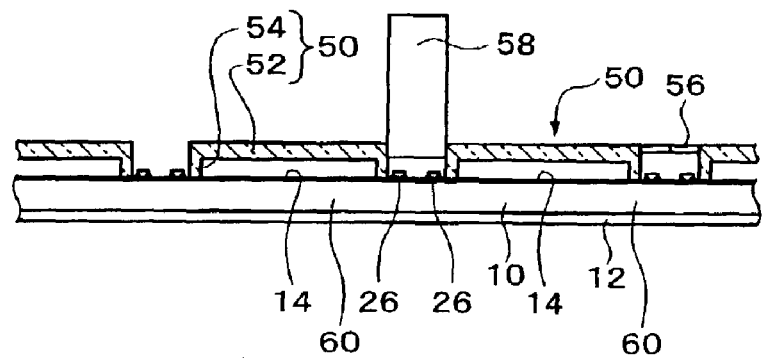
FIG. 8 illustrates a second embodiment of the method of manufacturing an optical device according to the present invention.

FIGS. 7A, 7B, and 8 illustrate a second embodiment of the method of manufacturing an optical device according to the present invention. It should be noted that FIG. 7B is a section along the line VIIB—VIIB in FIG. 7A. In this embodiment, a cover 50 is used. The cover 50 comprises a plate 52 and spacer 54, and to these the description of the plate 32 and spacer 34 in the first embodiment apply. Adjacent covers 50 are connected by connecting sections 56, and are thus relatively fixed in position. A plurality of the covers 50 and a plurality of connecting sections 56 may be formed integrally (for example, by injection molding or the like).

As shown in FIG. 7A, a plurality of rectangular covers 50 may be disposed in a matrix, connected by the connecting sections 56 at the corners of adjacent covers 50. Each of the connecting sections 56 connects a plurality of (in the example shown in FIG. 7A, four) of the covers 50. The connecting sections 56 comprise first portions extending from the covers 50 (for example, the corners thereof), and a second portion connecting a plurality of the first portions. The first portion may extend in the direction of an extension of the diagonal of the plate 52. The second portion may be positioned at the center of the space between adjacent covers 50 or substantially at the center. The connecting sections 56 may be formed to be thinner than the plate 52. As shown in FIG. 7B, the connecting sections 56 may be flush (or substantially flush) with the plate 52 on the surface opposite to that in the direction in which the spacer 54 projects.

As shown in FIG. 8, this embodiment of the method of manufacturing an optical device includes the separation of the connecting sections 56. Rather than simply cutting the connecting sections 56, they may be removed. For example, as shown in FIG. 8, the connecting sections 56 can be cut with a cutter 58 having a width close to the spacing between adjacent covers 50. The separation line is positioned over the electrodes 26 on the substrate 10. By removing the connecting sections 56, the space above the electrodes 26 is opened up, and electrical connection to the electrodes 26 is made easier.

The separation (or removal) of the connecting sections 56 is carried out so as not to damage the surface of the substrate 10 or the electrodes 26. In this embodiment, the surface of the connecting sections 56 facing the substrate 10 is positioned further away from the substrate 10 than the surface of the plate 52 facing the substrate 10. As a result, since the surface of the connecting sections 56 is displaced away from the electrodes 26, the extremity of the cutter 58 is less likely to contact the electrodes 26. It should be noted that the cutter 58 (for example, a dicing blade) performing separation (removal) of the connecting sections 56 may have a width greater than that of the cutter 38 (see FIG. 5B) separating the substrate 10. It should be noted that the cutter 58 can be referred to as the first cutter, and the cutter 38 as the second cutter.

Third Embodiment

Figure 9:
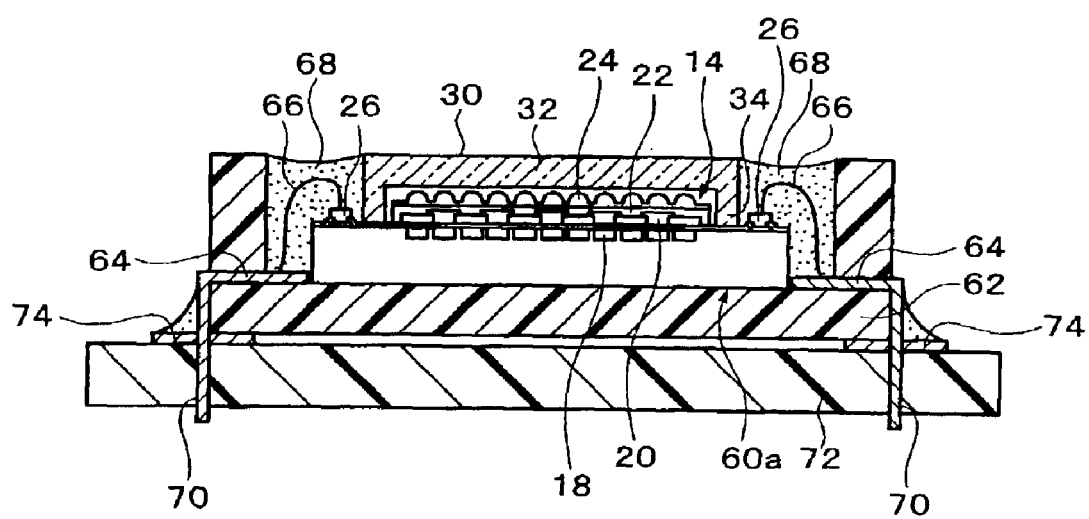
FIG. 9 illustrates a third embodiment of the present invention being an optical module and circuit board.

FIG. 9 shows a third embodiment of the present invention, being an optical module and circuit board. The optical module shown in FIG. 9 comprises the optical element 60*a* shown in FIG. 6A. The optical element 60*a* is attached to a support member (for example, a case) 62. On the support member 62, interconnecting lines 64 are formed. The support member 62 may be an MID (Molded Interconnect Device). The electrodes 26 of the optical element 60*a* and the interconnecting lines 64 are electrically connected. For the electrical connection, for example, wires 66 maybe used. The electrical connections (for example, the wires 66 and their bonded portions) are provided with a sealing material 68. That is to say, the electrical connections are sealed by the sealing material 68. The sealing material 68 may be provided, for example, by potting. Since the optical element 60*a* has the optical section 14 sealed by the cover 30, and the cover 30 functions as a dam, the sealing material 68 does not cover the optical section 14.

A part of the interconnecting lines 64 forms external terminals (for example, leads) 70. The external terminals 70 are electrically connected to an interconnecting pattern 74 formed on a circuit board 72. In the example shown in FIG. 9, holes are provided in the circuit board 72, and the external terminals 70 are inserted into these holes. Around these holes, the interconnecting pattern 74 has lands formed, and these lands and the external terminals 70 are bonded with a brazing material (for example solder). In this way, the optical module is mounted on the circuit board 72.

Although not shown in the drawings, the support member 62 may equally not be provided with the external terminals 70 or the like. That is to say, the support member 62 may be a circuit board.

Other Embodiments

Figure 10:
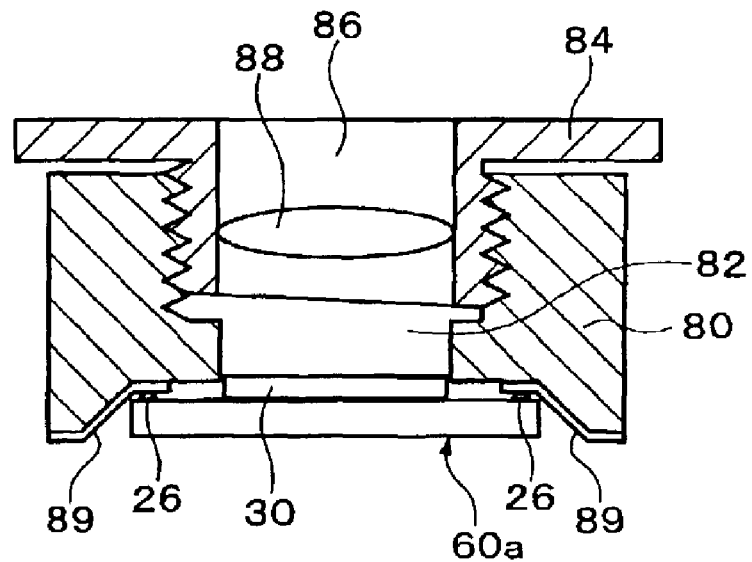
FIG. 10 shows an embodiment of an optical module according to the present invention.

FIG. 10 illustrates an embodiment of the optical module of the present invention. The optical module shown in FIG. 10 comprises the optical element 60*a* shown in FIG. 6A, and a support member 80 to which this is attached. In the support member 80, a hole 82 is formed, and at least a part of the cover 30 is positioned within the hole 82. A lens holder 84 is fitted in the hole 82. In the lens holder 84 too, a hole 86 is formed, and a lens 88 is fitted within this. The holes 86 and 82 are communicating, and light concentrated by the lens 88 enters the cover 30. It should be noted that the cover 30 (or at least its plate 32) maybe such as to cut radiation in the infrared region. For the bonding of the electrodes 26 of the optical element 60*a* with interconnecting lines 89 of the support member 80, any of an adhesive, an anisotropic conducting material, an anisotropic conducting film, and metal bonding may be applied. Between the optical element 60*a* and support member 80, an underfill not shown in the drawings may be provided.

Figure 11:
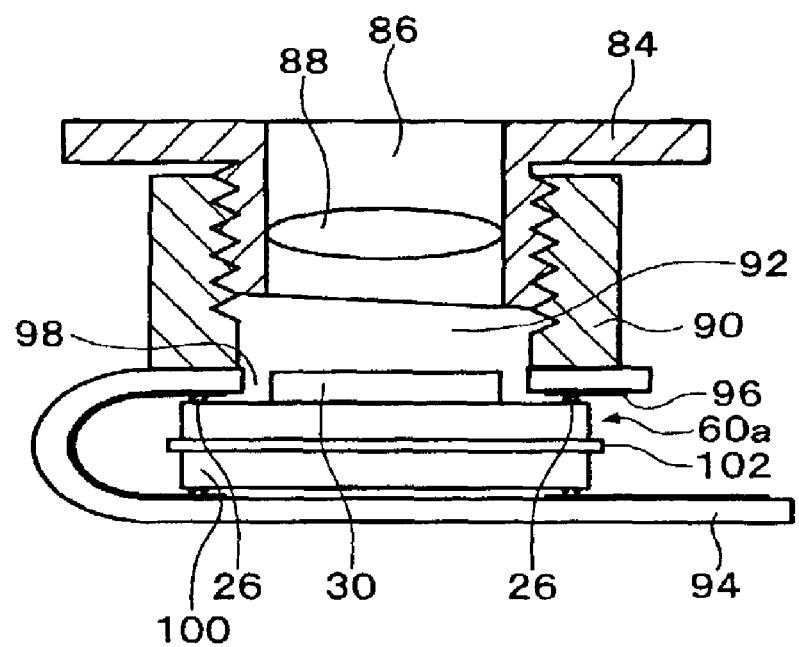
FIG. 11 shows an embodiment of an optical module according to the present invention.

FIG. 11 illustrates an embodiment of the optical module of the present invention. The optical module shown in FIG. 11 comprises the optical element 60*a* shown in FIG. 6A, and a support member 90 to which this is attached. In the support member 90 a hole 92 is formed, and at least a part of the cover 30 (or at least its plate 32) is positioned within the hole 92. A lens holder 84 is fitted in the hole 92 (details as described above).

In FIG. 11, the optical element 60*a* is mounted on a substrate 94, and its electrodes 26 are bonded to an interconnecting pattern 96 formed on the substrate 94. For this bonding, any of an adhesive, an anisotropic conducting material, an anisotropic conducting film, and metal bonding may be applied. Between the optical element 60*a* and substrate 94, an underfill not shown in the drawings may be provided. In the substrate 94 also, a hole 98 is formed. The holes 86, 92, and 98 are communicating, and light concentrated by the lens 88 impinges on the first substrate 10.

On the substrate 94, an electronic component (for example, a semiconductor chip) 100 is mounted (for example, by face down mounting). The electronic component 100 is electrically connected to the interconnecting pattern 96. On the substrate 94, a plurality of other electronic components may be mounted. The substrate 94 is bent, and the electronic component 100 and optical element 60*a* are adhered together with an adhesive 102 interposed. It should be noted that the optical element 60*a* and electronic component 100 may each be previously mounted on the substrate 94 before bending the substrate 94, and adhering the optical element 60*a* and electronic component 100.

Figure 12:
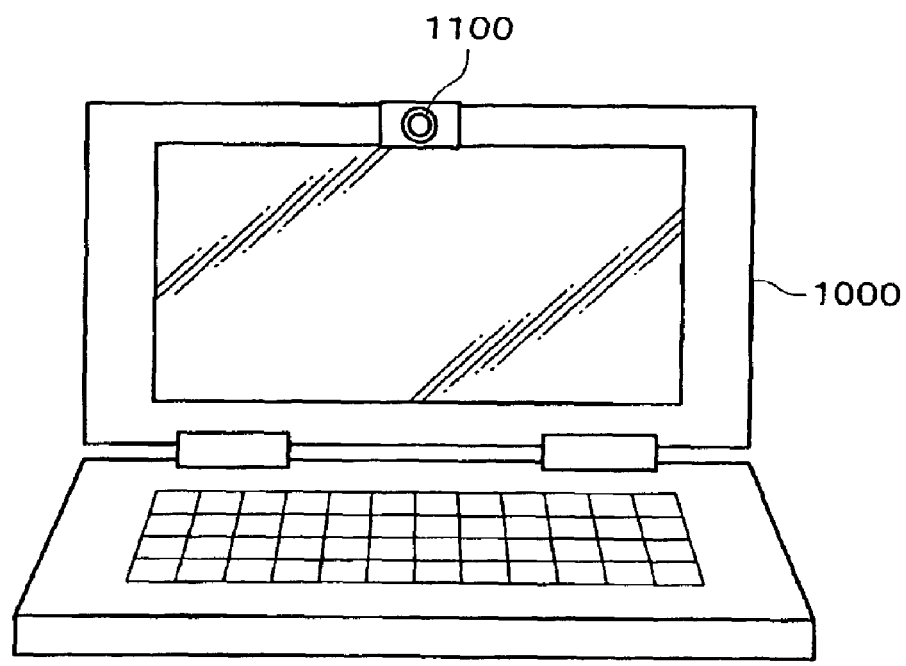
FIG. 12 shows an embodiment of an electronic instrument according to the present invention.
Figure 13:
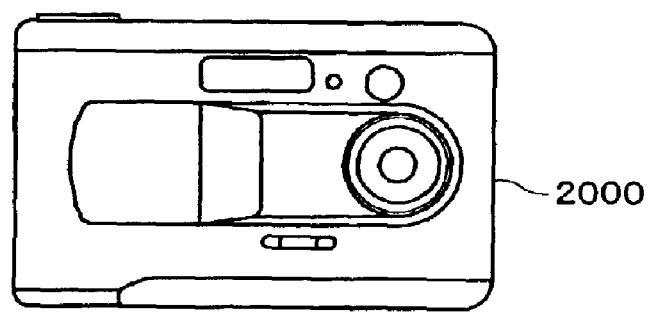
FIG. 13 shows an embodiment of an electronic instrument according to the present invention.
Figure 14A:
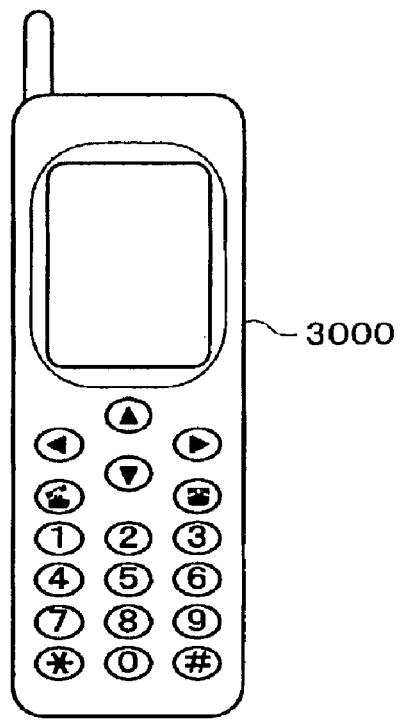
FIGS. 14A and 14B show embodiments of an electronic instrument according to the present invention.
Figure 14B:
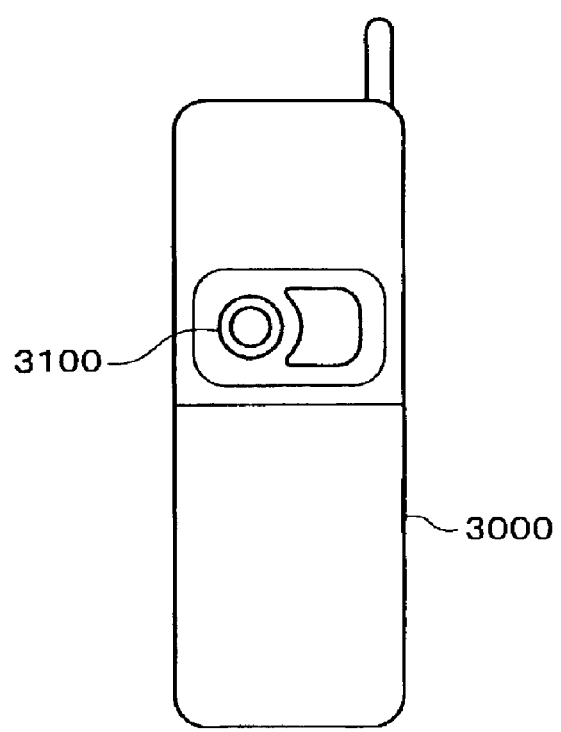

As an embodiment of the electronic instrument of the present invention, a notepad personal computer 1000 shown in FIG. 12 has a camera 1100 in which is incorporated an optical module. A digital camera 2000 shown in FIG. 13 has an optical module. Further, a portable telephone 3000 shown in FIGS. 14A and 14B has a camera 3100 in which is incorporated an optical module.

What is claimed is:

1. A method of manufacturing an optical device comprising:

(a) attaching a plurality of covers each of which has a light transmitting section to a substrate on which is formed a plurality of optical elements each of which has an optical section, in a single operation in a state in which the covers are relatively fixed, and sealing each of the optical sections by each of the covers, the covers connected by connecting sections so that the covers are relatively fixed; and (b) cutting the connecting sections by a first cutter and cutting the substrate by a second cutter into individual ones of the optical elements.

2. The method of manufacturing an optical device as defined in claim 1, wherein the covers are formed integrally together with the connecting sections.

3. The method of manufacturing an optical device as defined in claim 1, wherein the width of the first cutter is greater then the width of the second cutter.

4. The method of manufacturing an optical device as defined in claim 3, wherein each of the optical elements has electrodes formed on outside of each of the optical sections, and wherein parts of the connecting sections above the electrodes are removed, when the connecting sections are cut.

5. The method of manufacturing an optical device as defined in claim 1, wherein each of the covers entirely has light transmitting characteristics.

6. The method of manufacturing an optical device as defined in claim 1, wherein each of the covers comprises a plate section to be disposed above each of the optical sections, and a spacer section formed on the periphery of the plate section, and at least a part of the plate section is the light transmitting section.

7. The method of manufacturing an optical device as defined in claim 1, wherein, in the step (a), each of the optical sections is sealed so that a space is formed between each of the covers and each of the optical sections.

8. The method of manufacturing an optical device as defined, in claim 7, wherein, in the step (a), each of the optical sections is sealed so that the space is evacuated.

9. The method of manufacturing an optical device as defined in claim 7, wherein, in the step (a), each of the optical sections is sealed by decreasing pressure of the space lower than atmospheric pressure.

10. The method of manufacturing an optical device as defined in claim 7, wherein, in the step (a), each of the optical sections is sealed so that the space is filled with nitrogen.

11. The method of manufacturing an optical device as defined in claim 7, wherein, in the step (a), each of the optical sections is sealed so that the space is filled with dry air.

12. The method of manufacturing an optical device as defined in claim 1, wherein at least visible light passes through the light transmitting section, and no infrared light passes through the light transmitting section.

13. The method of manufacturing an optical device as defined in claim 1, wherein the substrate an which the optical sections are formed is a semiconductor wafer.

14. The method of manufacturing an optical device as defined in claim 1, wherein each of the optical sections has a plurality of light receiving sections arranged for image sensing.

15. The method of manufacturing an optical device as defined in claim 14, wherein each of the optical sections has a color filter provided above each of the light receiving section.

16. The method of manufacturing an optical device as defined in claim 14, wherein each of the optical sections has a microlens array on a surface of the substrate.

* * * * *